United States Patent [19]

Ikezi et al.

[11] Patent Number: 5,043,682
[45] Date of Patent: Aug. 27, 1991

[54] PRINTED CIRCUIT DISPERSIVE TRANSMISSION LINE

[75] Inventors: Hiroyuki Ikezi, Rancho Santa Fe; Yuh-Ren Lin-Liu, San Diego; John S. DeGrassie, Encinitas, all of Calif.

[73] Assignee: The United States of America as represented by the United States Department of Energy, Washington, D.C.

[21] Appl. No.: 487,323

[22] Filed: Mar. 2, 1990

[51] Int. Cl.5 .............................................. H04B 3/04
[52] U.S. Cl. ...................................... 333/20; 333/161; 333/238
[58] Field of Search .................. 333/161, 20, 156, 238, 333/246, 140, 116, 117, 120, 125, 128, 136; 328/65; 307/306

[56] References Cited

U.S. PATENT DOCUMENTS

| | | | |
|---|---|---|---|
| 3,670,270 | 6/1972 | Storey, II | 333/161 |
| 3,849,745 | 11/1974 | Schellenberg et al. | 333/161 |
| 3,980,972 | 9/1976 | Podell et al. | 333/116 |
| 4,288,760 | 9/1981 | Beyer et al. | 333/116 |
| 4,448,479 | 5/1984 | Alferness | 350/96.13 X |
| 4,533,840 | 8/1985 | Gheewala et al. | 307/306 |
| 4,718,568 | 12/1979 | Gunton | 333/116 |
| 4,719,429 | 1/1988 | Ikezi et al. | 328/65 |

FOREIGN PATENT DOCUMENTS 0798629  7/1958  United Kingdom ................ 333/204

Primary Examiner—Eugene R. LaRoche
Assistant Examiner—Seung Ham
Attorney, Agent, or Firm—Miguel A. Valdes; Roger S. Gaither; William R. Moser

[57] ABSTRACT

A printed circuit dispersive transmission line structure is disclosed comprising an insulator, a ground plane formed on one surface of the insulator, a first transmission line formed on a second surface of the insulator, and a second transmission line also formed on the second surface of the insulator and of longer length than the first transmission line and periodically intersecting the first transmission line. In a preferred embodiment, the transmission line structure exhibits highly dispersive characteristics by designing the length of one of the transmission line between two adjacent periodic intersections to be longer than the other.

18 Claims, 3 Drawing Sheets

PRINTED CIRCUIT DISPERSIVE TRANSMISSION LINE

BACKGROUND OF THE INVENTION

The invention described herein arose in the course of, or under, Contract No. DE-AC03-87SF17119 between the United States Department of Energy and General Atomics.

Transmission lines can be formed as meander lines to provide signal delay. For example, in U.S. Pat. No. 3,670,270 a signal delay line is shown comprising one or more signal lines having a meandering geometry on a dielectric layer formed over a ground plane element. The delay is related to the length of the signal line or lines as well as the electromagnetic properties such as the permeability and permittivity of the region surrounding the signal line.

It is known to form transmission lines having dispersive characteristics. For example, Schellenberg et al. U.S. Pat. No. 3,849,745 describes a system for varying the phase dispersion characteristics of a dispersive delay line by selectively changing the ratio between the gap spacing of interacting line segments (S) and the pitch of the interacting line segments (D). The meander line is embedded in a surface of a first substrate and metal portions are embedded in a surface of a second substrate with the two surfaces in slidable contact so that the metal portions are in slidable contact with the meander line to effectively change the pitch of the meander line by increasing the width of parallel segments of the line and thereby decreasing the spacing between such parallel segments.

Ikezi et al. U.S. Pat. No. 4,719,429 discloses a device for generating high power microwave pulses using a nonlinear dispersive transmission line comprising an outer conductor and an inner conductor with two different insulators disposed in the space between the conductors to provide two different propagation rates for high energy input pulses to selectively disperse the input pulses along the device.

However, to form a microwave generation structure such as needed for the generation of solitons, it is necessary to construct a transmission line which is more highly dispersive than prior art transmission lines with dispersive characteristics.

SUMMARY OF THE INVENTION

It is, therefore, an object of the invention to provide a highly dispersive transmission line structure capable of generating solitons.

It is another object of the invention to provide a highly dispersive transmission line structure comprising an insulator, a ground plane formed on one surface of the insulator, a first transmission line formed on a second surface of the insulator, and a second transmission line also formed on the second surface of the insulator and of longer length than the first transmission line and periodically intersecting the first transmission line.

It is yet another object of the invention to provide a highly dispersive transmission line structure comprising an insulator, a ground plane formed on one surface of the insulator, a first transmission line formed on a second surface of the insulator, and a second transmission line also formed on the second surface of the insulator and periodically intersecting the first transmission line, wherein the length of the second transmission line between the periodic intersections is at least three times the length of the first transmission line between the intersections.

It is a further object of the invention to provide a highly dispersive transmission line structure comprising an insulator, a ground plane formed on one surface of the insulator, a first transmission line generally formed as a straight line on a second surface of the insulator, and a second transmission line generally formed on the second surface of the insulator as a curved line and periodically intersecting the first transmission line, wherein the length of the second transmission line between the periodic intersections is at least three times the length of the first transmission line between the intersections.

It is still a further object of the invention to provide a highly dispersive transmission line structure comprising an insulator, a ground plane formed on one surface of the insulator, a first transmission line generally formed as a curved line on a second surface of the insulator, and a second transmission line also generally formed on the second surface of the insulator as a curved line and periodically intersecting the first transmission line, wherein the length of the second curved transmission line between the periodic intersections is at least three times the length of the first curved transmission line between the intersections.

These and other objects of the invention will be apparent from the following description and accompanying drawings.

DETAILED DESCRIPTION OF THE INVENTION

Figure 1:
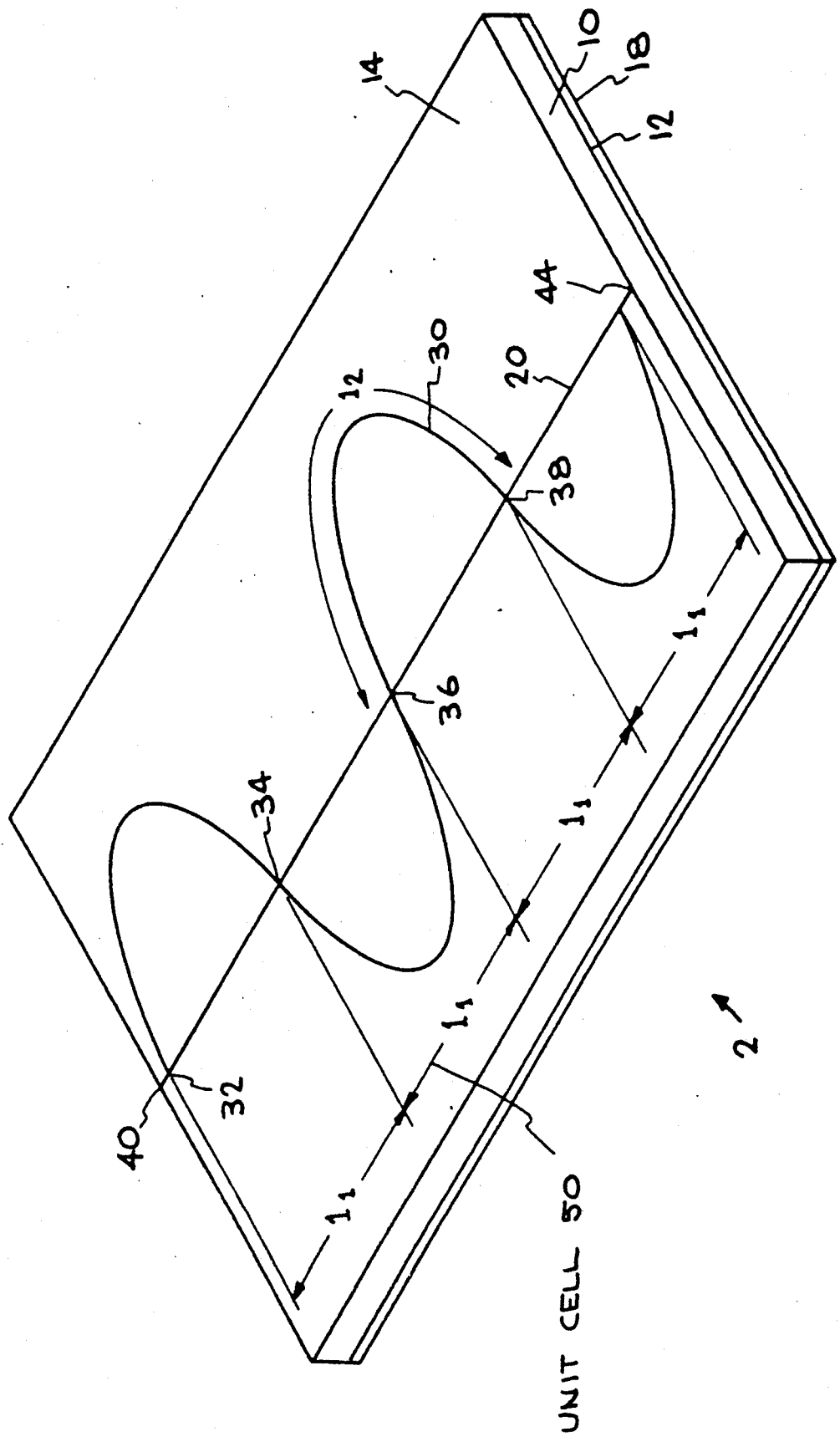
FIG. 1 is an isometric view of a first embodiment of the invention showing one transmission line formed as a generally straight line on one surface of an insulator with the other transmission line formed as a sinusoidal curve on the same insulator surface.

Turning now to FIG. 1, the first embodiment of the transmission line structure of the invention is generally shown at 2 comprising a sheet of dielectric material 10, a ground plane electrode 18 formed on the entire area of one surface 12 of dielectric sheet 10, a first transmission line 20 formed as a straight line across the opposite surface 14 of dielectric sheet 10, and a second transmission line 30 also formed on surface 14 and having a sinusoidal shape. Second transmission line is shown as periodically intersecting transmission line 20 at the crossover or midpoints 32, 34, 36, and 38 of the sine wave comprising second transmission line 30.

Dielectric sheet 10 may comprise any dielectric material providing an insulator between ground plane electrode 18 and transmission lines 20 and 30. Preferably dielectric 10 will comprise a ceramic material. In a preferred mode where the transmission line structure will be both highly dispersive and also nonlinear to provide for the generation of solitons, dielectric 10 will have a permittivity of at least 4000 to provide the desired nonlinear effects. The use of a ceramic dielectric material such as strontium titanate having the formula $Sr_xBa_{(1-x)}TiO_3$, where x ranges from 0 to 1 will result in a transmission line having nonlinear effects.

It will be noted that the distances $l_1$ along first transmission line 20, in FIG. 1, between points 32 and 34, 34 and 36, and 36 and 38 are all equal; and that the distances $l_2$ along the curves of second transmission line 30, between the same points are also equal to one another. Furthermore, it will be noted, of course, that the distances $l_1$ and $l_2$ along the respective transmission lines between the same adjacent points are not of the same length.

In accordance with the invention, to provide the desired degree of dispersion in the transmission structure of the invention, the length $l_2$ of each segment of second transmission line 30 between adjacent intersection points should be at least three times the corresponding length $l_1$ of each segment of first transmission line 20 between the same adjacent intersecting points. To provide sufficient dispersion so that the phase velocity at the highest frequency is only 50 to 70% of the phase velocity at the lowest frequency, the length $l_2$ of transmission line 30 between adjacent intersection points should range from at least three times up to about five times the length $l_1$ of transmission line 20 between the same intersection points.

It should be noted at this point that although alternate embodiments for the shapes or dispositions of the first and second transmission lines will be discussed below, the concepts discussed here with respect to the $l_2/l_1$ ratio, i.e., the ratio of the length of the segment of the second transmission line from one crossover or intersection point to the adjacent point, e.g., the length of $l_2$, to the length of the segment of the first transmission line between the same points, e.g., the length of $l_1$, are common to all of the embodiments which will be disclosed.

The respective repeating transmission line paths or segments $l_1$ and $l_2$ between each crossover point may be considered as a unit cell 50 with the unit cell then repeating itself across surface 14 of dielectric sheet 10 from an entry point 40 on surface 14 to a terminating or exit point 44 located at a position on surface 14 spaced from entry point 40. The number of unit cells 50 which are produced on surface 14 of dielectric sheet 10 will vary depending on the purpose of application and may range from as few as 5 unit cells to as many as 100 unit cells. In the case of soliton generation, unit cell 50 will repeat itself about 30 times as the waves propagate from entry point 40 to exit point 44 on surface 14 of dielectric sheet 10. The dispersion relation, that is, the relation between the angular frequency ω and the wave number k, is given by the equation:

$$\cos K = \cos((l_1+l_2)/2 * \omega/v)/\cos((l_1-l_2)2*\omega/v)$$

wherein $l_1$ and $l_2$ are the respective line lengths of the first and second transmission lines in a unit cell, v is the signal propagation speed in each line, ω is the angular frequency of the signal, and K is the unit of inverse cell number. This equation finds that there is no dispersion effect when $l_1 = l_2$. However, as $l_2/l_1$ increases, the signal phase velocity, ω/K becomes smaller at $K = \pi$ than ω/K at $K = 0$. Thus, the stronger dispersion effect appears at larger values of $l_2/l_1$. For the generation of solitons, the optimum value of $l_2/l_1$ is about 3.

Figure 2:
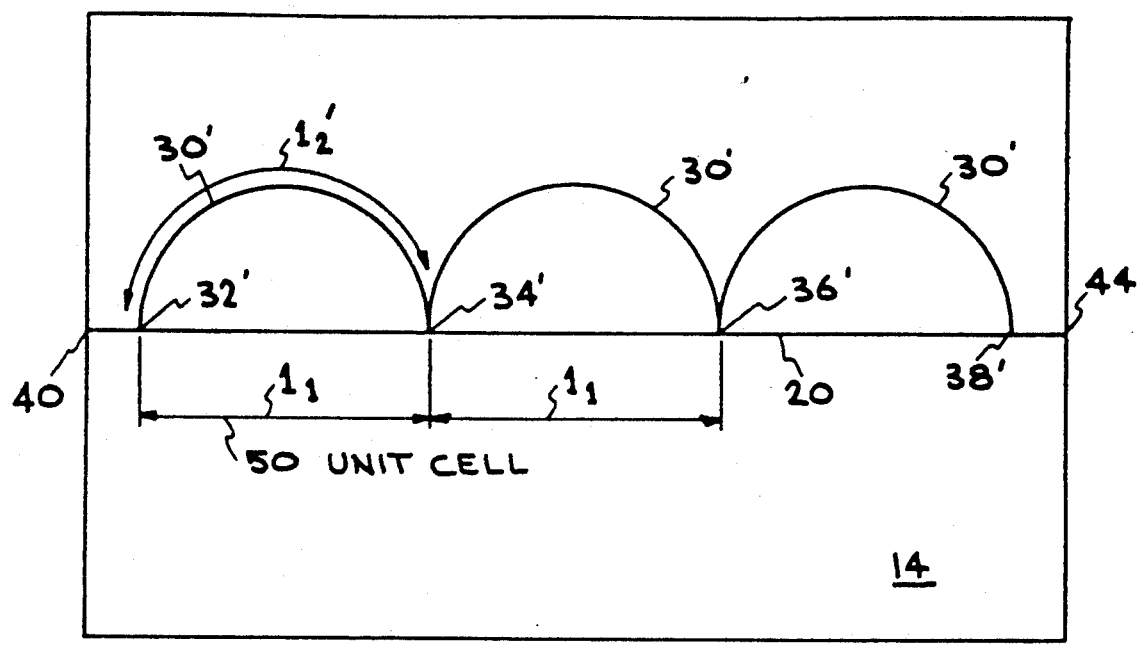
FIG. 2 is a top view of another embodiment of the invention wherein the second transmission line is shown as a series of half waves periodically rising from and falling to one side of the straight first transmission line.

FIG. 2 shows a second embodiment of the invention generally indicated as 2' which differs from the first embodiment only in the shape of second transmission line 30' which is shown in this embodiment as a series of identically half waves periodically rising and falling on one side of straight first transmission line 20, i.e., similarly to a full wave rectification trace.

As previously mentioned, the concept of repeating unit cells between the adjacent intersections along first transmission line 20 and second transmission line 30', as is also present in this embodiment as well. Thus the length $l_2'$ of each repeating curve of second transmission line 30' between intersection points 32' and 34', 34' and 36', and 36' and 38' is the same and is at least three times the length $l_1$ of first transmission line 20 between the same points.

Figure 3:
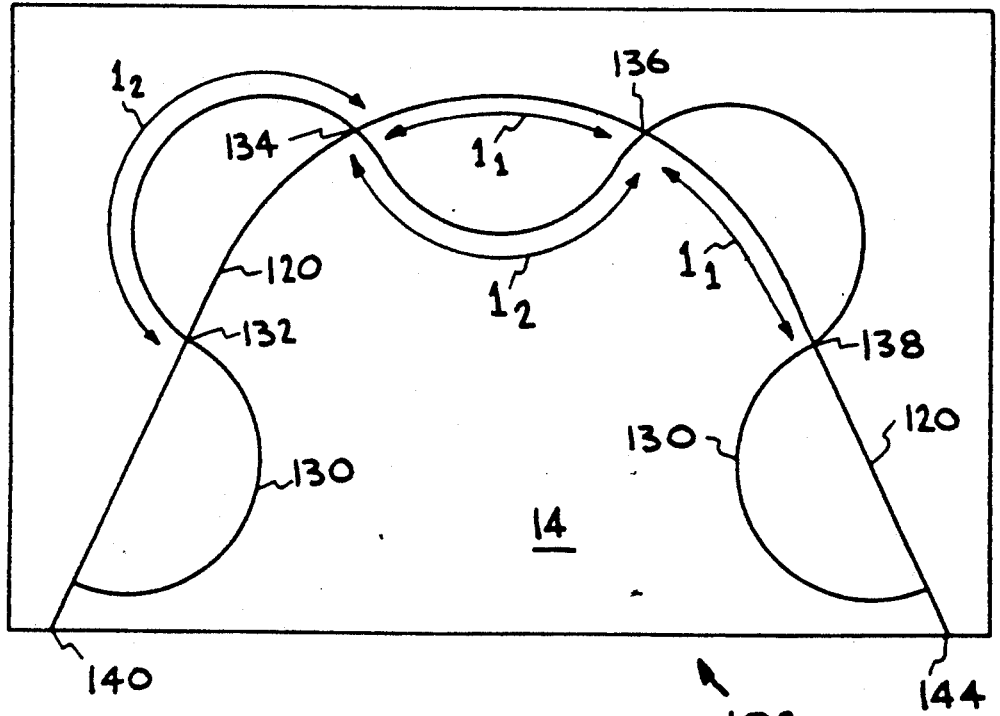
FIG. 3 is a top view of another embodiment of the invention wherein the second transmission line is shown as a series of curves of equal length which periodically intersect a curved first transmission line.

FIG. 3 shows another embodiment of the invention generally at 102 with entry point 140 and exit point 14 wherein second transmission line 130 is shown as a series of curves of equal length which periodically cross or intersect a curved first transmission line 120 at points 132, 134, 136, and 138, etc. As previously discussed, the ratios of the respective lengths $l_1$ and $l_2$ of the two curves between adjacent crossing points remains the same as in the previous embodiments.

Figure 4:
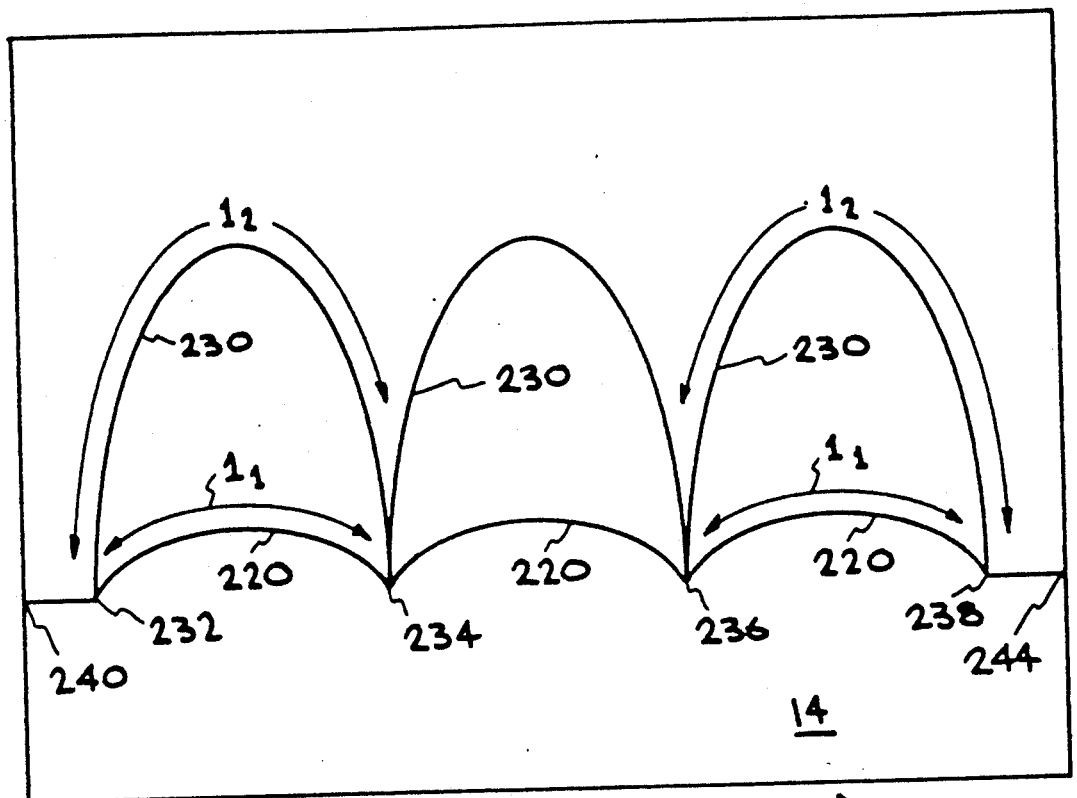
FIG. 4 is a top view of another embodiment of the invention wherein the first and second transmission lines are respectively shown as a periodic series of half waves of different amplitude, but both arising from one side of an imaginary axis and joined together at their ends.

FIG. 4 shows yet another embodiment of the invention at 202 wherein first transmission line 220 and second transmission line 230, having an entry point at 240 and an exit point at 244, are respectively shown as a periodic series of half waves of different amplitude, but both arising from one side of an imaginary axis and joined together at their ends, i.e., at points 232, 234, 236, and 238, etc. with the ratios of the respective curve lengths $l_1$ and $l_2$ between adjacent points remaining the same as in previous embodiments.

Figure 5:
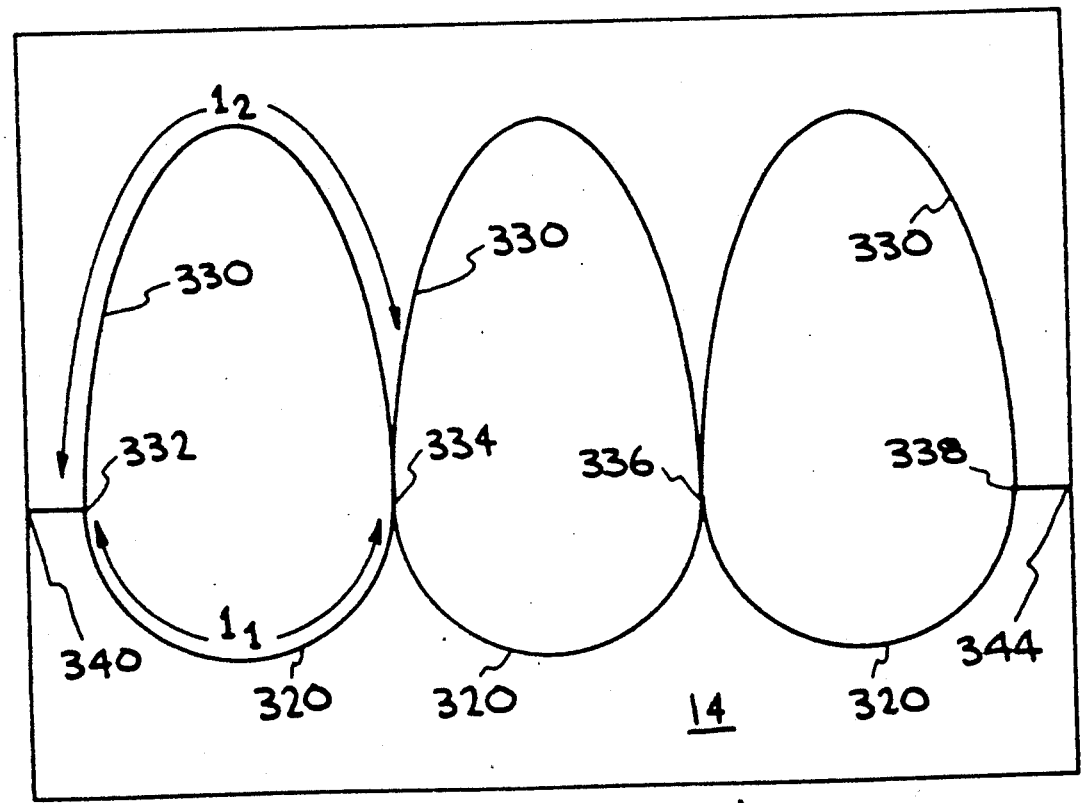
FIG. 5 is a top view of another embodiment of the invention wherein the first transmission line is shown as a series of periodic half waves arising from one side of an imaginary axis and the second transmission line is shown as a periodic series of half waves rising from the opposite side of the imaginary axis and of larger amplitude, with each of the half waves of one transmission line joined at their ends to the ends of the half waves of the other transmission line.

FIG. 5 illustrates still another embodiment of the invention at 302 wherein first transmission line 320, having an entry point at 340 and an exit point at 344, is shown as a series of periodic half waves arising from one side of an imaginary axis and second transmission line 330 is shown as a periodic series of half waves rising from the opposite side of the imaginary axis and of sufficiently larger amplitude to provide the previously discussed minimum ratio of respective curve lengths, $l_1$ and $l_2$, between adjacent points 332 and 334, 334 and 336, 336 and 338, etc.

Thus, the invention provides an improved transmission line structure having highly dispersive characteristics by providing two periodically crossing or intersecting transmission lines on a single surface of a dielectric wherein the length of one of said transmission lines between adjacent intersecting points is at least three times the length of the other transmission line between the same two adjacent intersecting points.

While a specific embodiment of the highly dispersive transmission line structure of the invention has been illustrated and described for constructing such a transmission line structure in accordance with this invention, modifications and changes of the apparatus, parameters, materials, etc. will become apparent to those skilled in the art, and it is intended to cover in the appended claims all such modifications and changes which come within the scope of the invention.

What is claimed is:

1. A printed circuit dispersive transmission line structure comprising an insulator, a ground plane formed on one surface of said insulator, a first transmission line formed on a second surface of said insulator, and a second transmission line formed on said second surface which periodically intersects said first transmission line; said second transmission line having a length, between said periodic intersections, of at least three times the length of said first transmission line between said periodic intersections.

2. The printed circuit dispersive transmission line structure of claim 1 wherein the length of said second transmission line between said periodic intersections ranges from about three to about five times the length of said first transmission line between said intersections.

3. The printed circuit dispersive transmission line structure of claim 2 wherein said first transmission line is generally formed on said insulator surface as a straight line and said second transmission line is generally curved in shape.

4. The printed circuit dispersive transmission line structure of claim 1 wherein said first transmission line is generally formed on said insulator surface as a curved line and said second transmission line is also generally curved in shape, with the curved portions of said second transmission line between said periodic intersections defining a length at least three times the length of said curved portions of said first transmission line between said intersections.

5. A printed circuit dispersive transmission line structure comprising an insulator, a ground plane formed on one surface of said insulator, a first transmission line formed on a second surface of said insulator, and a second transmission line formed on said second surface and generally shaped as a series of half waves of identical length beginning and ending at evenly spaced apart points periodically intersecting said first transmission line, the length of said second transmission line between said periodic intersection points ranging from about three to about five times the length of said first transmission line between said intersections.

6. The printed circuit dispersive transmission line structure of claim 5 wherein said first transmission line is generally formed on said insulator surface as a straight line and said second transmission line is generally sinusoidal in shape and with each of said intersections 180° apart on said sinusoidal shaped line.

7. A printed circuit dispersive microwave transmission line structure capable of generating solitons comprising an insulator, a ground plane formed on one surface of said insulator, a first transmission line formed as a generally straight line on a second surface of said insulator, and a second transmission line formed as a generally curved line on said second surface and of a length of at least three times that of said first transmission line and periodically intersecting said first transmission line at a plurality of intersection points along said first transmission line.

8. The printed circuit dispersive transmission line structure of claim 7 wherein the length of said second transmission line between said periodic intersections ranges from about three to about five times the length of said first transmission line between said intersections.

9. A printed circuit dispersive microwave transmission line structure comprising an insulator, a ground plane formed on one surface of said insulator, a first transmission line formed as a generally straight line on a second surface of said insulator, and a second transmission line on said second surface generally shaped as a series of half waves of identical length beginning and ending at periodic intersections on said first transmission line of evenly spaced apart distance, the length of said second transmission line between said periodic intersections ranging from about three to about five times the length of said first transmission line between said intersections.

10. The printed circuit dispersive transmission line structure of claim 9 wherein said second transmission line is generally sinusoidal in shape with each of said intersections 180° apart on said sinusoidal shaped line.

11. A printed circuit dispersive microwave transmission line structure capable of generating solitons comprising an insulator, a ground plane formed on one surface of said insulator, a first transmission line generally formed as a curved line on a second surface of said insulator, and a second transmission line also generally formed as a curved line on said second surface and of a length of at least three times that of said first transmission line and periodically intersecting said first transmission line at six or more intersection points along said first transmission line.

12. The printed circuit dispersive transmission line structure of claim 11 wherein the length of said second transmission line between said periodic intersections ranges from about three to about five times the length of said first transmission line between said intersections.

13. A printed circuit dispersive microwave transmission line structure comprising an insulator, a ground plane formed on one surface of said insulator, a first transmission line generally formed on a second surface of said insulator in the shape of half waves of identical length to one another, and a second transmission line also generally formed on said second surface in the shape of half waves of identical length to one another with the ends of the half waves on said first and second transmission lines joined together at periodic intersections, the length of said second transmission line between said periodic intersections ranging from about three to about five times the length of said first transmission line between said intersections.

14. The printed circuit dispersive transmission line structure of claim 13 wherein said first transmission line is generally formed on said insulator surface in the shape of half waves of identical length to one another and formed on one side of an imaginary axis in the form of a full wave rectification trace; said second transmission line is also generally formed in the shape of half waves of identical length to one another and formed on the same side of said imaginary axis in the form of a full wave rectification trace, but of larger amplitude than said waves of said first transmission line; and the ends of the half waves on said first and second transmission lines are joined together.

15. The printed circuit dispersive transmission line structure of claim 13 wherein said first transmission line is generally formed on said insulator surface in the shape of half waves of identical length to one another and formed on one side of an imaginary axis in the form of a full wave rectification trace; said second transmission line is also generally formed in the shape of half waves of identical length to one another and formed on the opposite side of said imaginary axis in the form of a full wave rectification trace, but of larger amplitude than said waves of said first transmission line; and the ends of the half waves on said first and second transmission lines are joined together.

16. A printed circuit dispersive microwave transmission line structure capable of generating solitons comprising an insulator having a permittivity of at least 4000, a ground plane formed on one surface of said insulator, a first transmission line formed on a second surface of said insulator, and a second transmission line generally formed as a curved line on said second surface and of a length of from about three to about five times that of said first transmission line and periodically intersecting said first transmission line.

17. The dispersive microwave transmission line structure of claim 16 wherein said insulator comprises strontium barium titanate having the formula $Sr_xBa_{(1-x)}TiO_2$, where x ranges from 0 to 1.

18. A printed circuit dispersive transmission line structure comprising an insulator, a ground plane formed on one surface of said insulator, a first transmission line formed on a second surface of said insulator generally in the shape of half waves of identical length to one another, and a second transmission line formed on said second surface forming periodic intersections with said first transmission line, said second transmission line generally formed in the shape of half waves of identical length to one another with the ends of the half waves on said first and second transmission lines joined together and with the amplitude of said half waves of said second transmission lines sufficiently larger than that of said half waves of said first transmission line to define paths, between joined ends comprising said periodic intersections, which are at least three times the length of each half wave of said first transmission line.

* * * * *